(12) United States Patent
Girard Desprolet et al.

(10) Patent No.: US 10,014,337 B2
(45) Date of Patent: Jul. 3, 2018

(54) METHOD OF MANUFACTURING A NANOSTRUCTURED SPECTRAL FILTER

(71) Applicants: STMicroelectronics SA, Montrouge (FR); STMicroelectronics (Crolles 2) SAS, Crolles (FR); Commissariat A L'Energie Atomique et aux Energies Alternatives, Paris (FR)

(72) Inventors: Romain Girard Desprolet, Grenoble (FR); Michel Marty, Saint Paul de Varces (FR); Salim Boutami, Grenoble (FR); Sandrine Lhostis, Thonon les Bains (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/280,544

(22) Filed: Sep. 29, 2016

(65) Prior Publication Data
US 2017/0092678 A1     Mar. 30, 2017

(30) Foreign Application Priority Data

Sep. 30, 2015   (FR) ..................... 15 59267

(51) Int. Cl.
*H01L 21/311*   (2006.01)
*H01L 27/146*   (2006.01)
(Continued)

(52) U.S. Cl.
CPC ........ *H01L 27/14625* (2013.01); *G02B 5/008* (2013.01); *G02B 5/201* (2013.01);
(Continued)

(58) Field of Classification Search
CPC ............. H01L 21/311; H01L 27/14621; H01L 27/14685; H01L 27/14865;
(Continued)

(56) References Cited

U.S. PATENT DOCUMENTS 6,238,850 B1   5/2001   Bula et al.
6,590,611 B1 *  7/2003   Ishida .................. H04N 3/1568
                                                    250/208.1
(Continued)

FOREIGN PATENT DOCUMENTS

EP   1589573 A2   10/2005
EP   2816007 A1   12/2014
(Continued)

OTHER PUBLICATIONS

INPI Search Report and Written Opinion for FR 1559267 dated Jun. 8, 2016 (8 pages).

*Primary Examiner* — Caridad Everhart
(74) *Attorney, Agent, or Firm* — Crowe & Dunlevy (57) ABSTRACT

A spectral filter is manufactured using a process wherein a first rectangular bar is formed within a first layer made of a first material, said first rectangular bar being made of a second material having a different optical index. The process further includes, in a second layer over the first layer, a second rectangular bar made of the second material. The second rectangular bar is positioned in contact with the first rectangular bar. The second layer is also made of the first material.

29 Claims, 4 Drawing Sheets

(51) Int. Cl.
  *G02B 5/20* (2006.01)
  *G02F 1/1335* (2006.01)
  *G02B 5/00* (2006.01)
  *B82Y 20/00* (2011.01)
(52) U.S. Cl.
  CPC ........ G02B 5/204 (2013.01); G02F 1/133509 (2013.01); G02F 1/133516 (2013.01); H01L 21/311 (2013.01); H01L 27/14621 (2013.01); H01L 27/14685 (2013.01); *B82Y 20/00* (2013.01); *G02B 2207/101* (2013.01)
(58) Field of Classification Search
  CPC ........ H01L 27/14625; G02B 2207/101; G02B 5/201; G02B 5/008; G02B 5/204; G02F 1/13356; B82Y 20/00
  See application file for complete search history.

(56) References Cited

U.S. PATENT DOCUMENTS

| | | | |
|---|---|---|---|
| 7,255,805 B2 * | 8/2007 | Stasiak | B82Y 10/00 216/24 |
| 2002/0164105 A1 * | 11/2002 | Simpson | G02B 5/1809 385/11 |
| 2004/0062503 A1 * | 4/2004 | Challener | B82Y 20/00 385/129 |
| 2005/0052724 A1 | 3/2005 | Suzuki et al. | |
| 2005/0150864 A1 * | 7/2005 | Stasiak | B82Y 10/00 216/41 |
| 2005/0169148 A1 * | 8/2005 | Noguchi | G11B 7/00456 369/59.11 |
| 2005/0254120 A1 * | 11/2005 | Zaczek | G02B 17/08 359/352 |
| 2008/0087800 A1 | 4/2008 | Toda | |
| 2008/0153299 A1 | 6/2008 | Kim | |
| 2008/0231946 A1 * | 9/2008 | Scott | G01J 3/36 359/350 |
| 2010/0177416 A1 * | 7/2010 | Jo | G02B 1/11 359/885 |
| 2011/0216229 A1 | 9/2011 | Mary et al. | |
| 2012/0200221 A1 * | 8/2012 | Inoue | H01L 51/5271 313/504 |
| 2013/0094093 A1 * | 4/2013 | Tanaka | C03C 17/007 359/642 |
| 2014/0374574 A1 | 12/2014 | Girard Desprolet et al. | |
| 2015/0036217 A1 * | 2/2015 | Nakano | G02B 5/203 359/568 |
| 2015/0145084 A1 | 5/2015 | Chang | |
| 2015/0301333 A1 * | 10/2015 | Levesque | G02B 5/1809 250/201.9 |
| 2016/0254303 A1 * | 9/2016 | Takimoto | G02B 5/20 257/432 |

FOREIGN PATENT DOCUMENTS

| | | |
|---|---|---|
| WO | WO-0225373 A2 | 3/2002 |
| WO | WO-2008002390 A1 | 1/2008 |
| WO | WO-2012018887 A2 | 2/2012 |
| WO | WO-2012058360 A2 | 5/2012 |
| WO | WO-2014010200 A1 | 1/2014 |

* cited by examiner

Fig 1

(PRIOR ART)

Fig 2

(PRIOR ART)

METHOD OF MANUFACTURING A NANOSTRUCTURED SPECTRAL FILTER

PRIORITY CLAIM

This application claims the priority benefit of French Application for Patent No. 1559267, filed on Sep. 30, 2015, the disclosure of which is hereby incorporated by reference in its entirety to the maximum extent allowable by law.

TECHNICAL FIELD

The present disclosure relates to a method of manufacturing a spectral filter.

BACKGROUND

Image sensors or displays integrated in microelectronic devices currently comprise an array of photodetectors or of photoemitters formed in a semiconductor substrate. Each of the photodetectors or photoemitters is generally topped with a spectral filter intended to only transmit light for one wavelength range.

A known type of spectral filter comprises a layer made of a first material having at least one pattern made of a second material, with an optical index different from that of the first material, formed therein. The pattern extends through the entire thickness of the layer of the first material and may be periodically repeated therein. In the case of a plasmonic spectral filter, one of the first and second materials is a metal and the other one is a dielectric.

Figure 1:
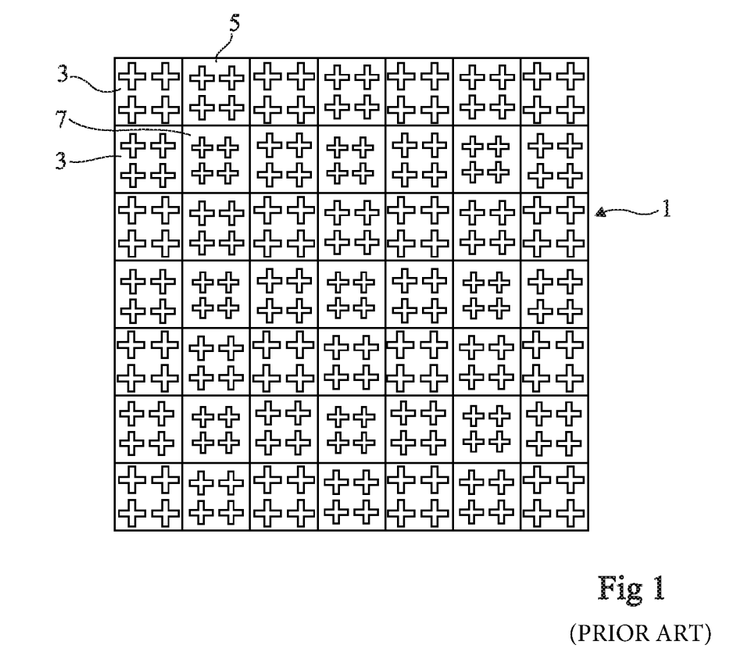
FIG. 1, previously described, shows a prior art filter structure.

FIG. 1 is a partial reproduction of FIG. 2 of United States Patent Application Publication No. 2014/0374574 (incorporated by reference). This drawing schematically shows, in top view, a network 1 of spectral filters 3, 5, and 7 arranged above an array of photodetectors, each filter 3, 5, and 7 being arranged above of photodetector of the array. Each filter is formed from a layer of a first material having cruciform patterns made of the second material formed therein. The pattern dimensions are selected according to the range of transmitted wavelengths so that the filter has as high as possible a light transmission rate and as high as possible a light rejection ratio outside of this range. According to the transmitted wavelength range, certain dimensions of the patterns may be smaller than some hundred nanometers.

In practice, to manufacture a filter of the type of those in FIG. 1, the layer of the first material is deposited, after which, for each pattern, a hole having the shape of the pattern is etched through the layer. The second material is then deposited to fill each hole and form the corresponding pattern therein.

In the case of patterns such as crosses or stars, for example having certain dimensions smaller than some hundred nanometers, such a manufacturing method has various disadvantages, some of which at least are desired to be overcome by the present disclosure.

SUMMARY

An embodiment provides a method of manufacturing a spectral filter comprising the successive steps of: a) forming, in a first layer made of a first material, a first rectangular bar made of a second material having an optical index different from that of the first material; and b) forming, in a second layer or in the second layer and at the same time in a portion at least of the first layer, a second rectangular bar made of the second material and in contact with the first bar, the second layer resting on the first layer and being made of the first material.

According to an embodiment, the first material and the second material are respectively a metal and a dielectric, or conversely.

According to an embodiment, step a) comprises the successive steps of: a1) etching through the entire thickness of the first layer a first rectangular cavity; and a2) filling the first cavity with the second material to form the first bar therein.

According to an embodiment, step b) comprises the successive steps of: b1) depositing the second layer on the first layer; b2) etching, through the entire thickness of the second layer and possibly through at least a portion of the thickness of the first layer, a second rectangular cavity; and b3) filling the second cavity with the second material to form the second bar therein.

According to an embodiment, step a2) comprises the successive steps of: depositing a layer of the second material on the first layer to fill the first cavity; and removing a portion of the second material by planarizing etching down to the upper surface of the first layer.

According to an embodiment, the first bar and the second bar extend lengthwise along different directions.

According to an embodiment, said directions are orthogonal.

Another embodiment provides a spectral filter comprising a layer made of a first material having a first bar and a second bar made of a second material of optical index different from that of the first material arranged therein, the second bar extending lengthwise along a direction different from that of the first bar and having a portion resting on the first bar.

Another embodiment provides an image sensor comprising: an array of photodetectors arranged inside and/or on top of a semiconductor substrate; and the above-mentioned spectral filter topping at least one photodetector of the array.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

The same elements have been designated with the same reference numerals in the different drawings and, further, the various drawings are not to scale. In the following description, terms "top", "bottom", "upper", and "lower" refer to the orientation of the concerned elements in the corresponding drawings. Unless otherwise specified, term "approximately" means to within 10%, preferably to within 5%.

Figure 2:
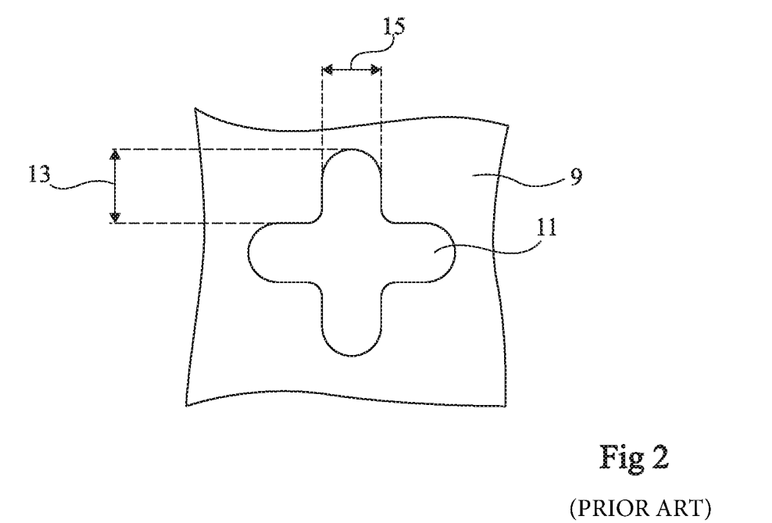
FIG. 2 is a simplified top view of a spectral filter pattern.

FIG. 2 is a simplified top view of a pattern of a spectral filter of the type of those in FIG. 1.

A cruciform hole has been etched through a layer 9 made of a first material, after which the hole has been filled with a second material to form a cruciform pattern 11 of the filter therein.

Due to technological limitations linked to the etch step, the angles of pattern 11 of the filter are not sharp, but rounded. It can be observed that the optical properties of such a filter (rejection ratio outside of the transmitted wavelength range, selectivity, insensitivity to the angle of incidence of light, etc.) are then poorer than expected. This is more particularly true when pattern 11 has dimensions smaller than some hundred nanometers, for example, when arms of the pattern have a first side with a length 13 smaller than 100 nm and a second side with a length 15 smaller than 100 nm. Such a degradation of the optical properties is imputed to the rounded character of the angles of the pattern.

It is here provided to manufacture a filter equivalent to those of FIGS. 1 and 2, by forming each pattern of the filter from bars made of the second material formed one after the others in a layer of the first material.

FIGS. 3A to 3D are cross-section and perspective views illustrating successive steps of a method of manufacturing a spectral filter.

Figure 3A:
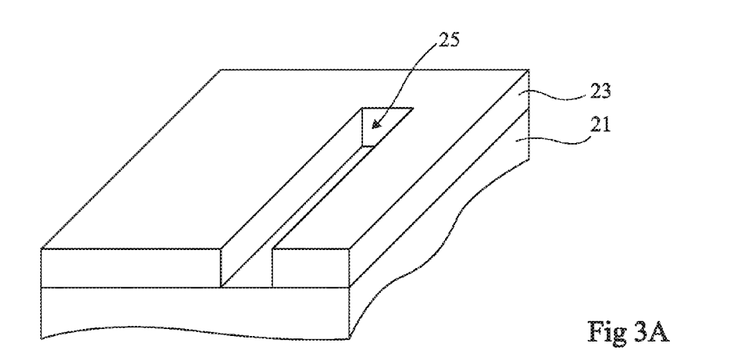
FIGS. 3A to 3E are cross-section and perspective views illustrating successive steps of a method of manufacturing a spectral filter.

FIG. 3A shows a structure comprising a support 21 after the deposition of a layer 23 of a first material on the upper surface of support 21, and the etching of a rectangular cavity 25 through the entire thickness of layer 23. Cavity 25 extends longitudinally along a first direction. An array of photodetectors are provided in or in conjunction with support 21.

Figure 3B:
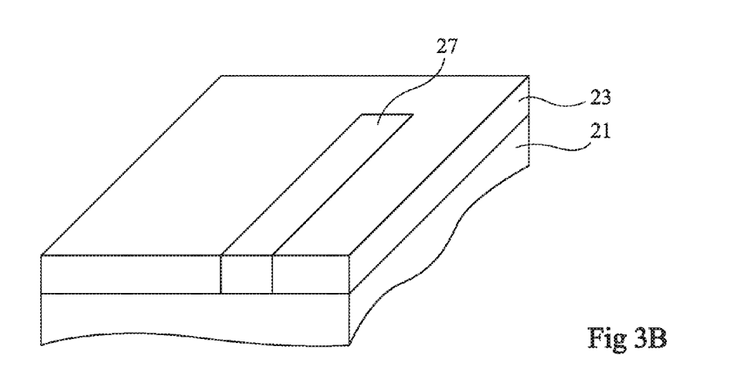

FIG. 3B shows the structure of FIG. 3A after the filling of cavity 25 with a second material to form a bar 27 therein. As an example, the cavity is filled by deposition of a layer of the second material on the upper surface of layer 23 and in cavity 25, and then by removing the excess second material by CMP ("Chemical Mechanical Polishing"), down to the upper surface of layer 23. The upper surface of bar 27 is then at the level of the upper surface of layer 23.

Figure 3C:
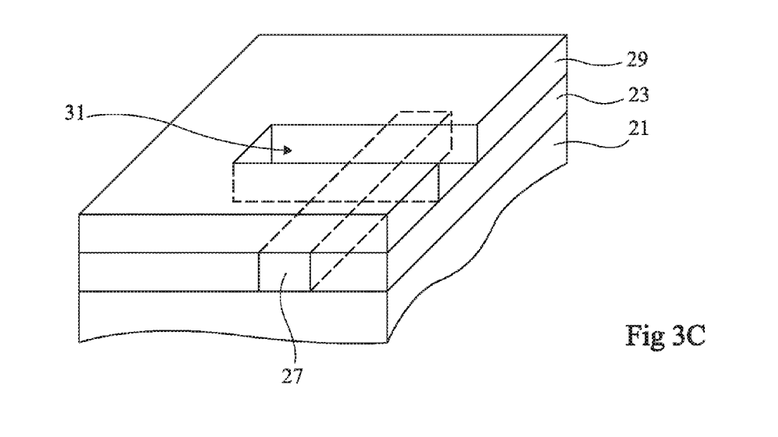

FIG. 3C shows the structure of FIG. 3B after the deposition of a layer 29 of the first material on the upper surface of layer 23 and the etching of a rectangular cavity 31 through the entire thickness of layer 29. The etching of cavity 31 is performed so that a portion of this cavity is opposite (i.e., crosses over) a portion of bar 27. Cavity 31 extends longitudinally in a second direction different from the first direction along which bar 27 extends. For example, the first and second directions are orthogonal.

In this embodiment, as shown in FIG. 3C, the etching of cavity 31 is stopped on bar 27, that is, at the level of the upper surface thereof.

Figure 3D:
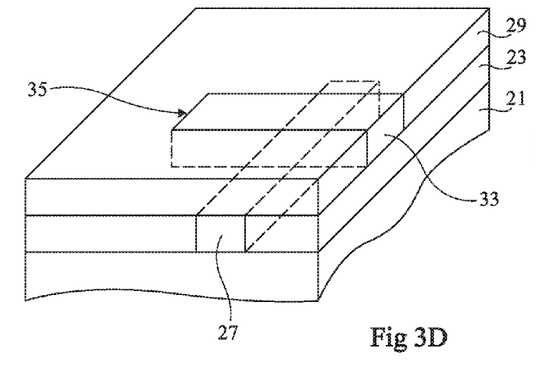
Figure 3E:
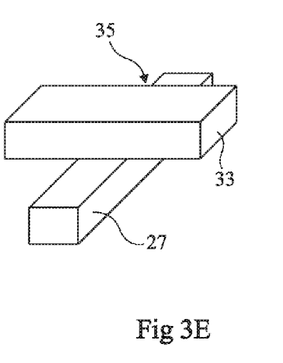

FIGS. 3D and 3E show the structure of FIG. 3C after the filling of cavity 31 with the second material to form therein a bar 33 which rests on bar 27, support 21 and layers 23 and 29 being absent from FIG. 3E. The two bars 27 and 33 form, in top view, not shown, a cruciform pattern 35 equivalent to pattern 11 of FIG. 2. Pattern 35 is at least partly free of the disadvantages of pattern 11. The pattern 35 overlies a photodetector of the array.

As an example, similarly to the step described in relation with FIG. 3B, cavity 31 is filled by deposition of a layer of the second material on the upper surface of layer 29 and into cavity 31, and then by removing the excess second material by planarizing etching. The planarizing etching may be stopped on the upper surface of layer 29, as shown herein, or above the upper surface of layer 29 so that there remains a layer of the second material coating the upper surface of layer 29.

Figure 4C:
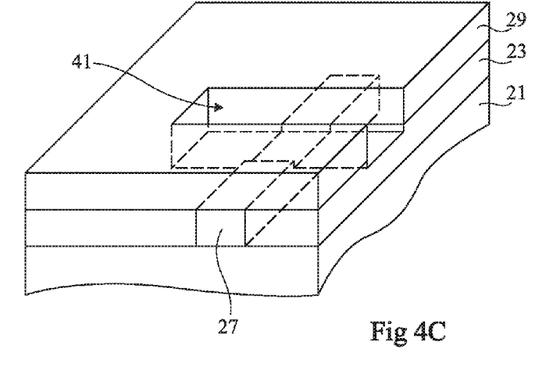
FIGS. 4C and 4E are cross-section and perspective views illustrating a variation of the steps of FIGS. 3C and 3E.
Figure 4E:
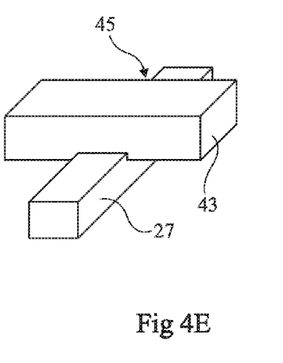

FIGS. 4C and 4E, similar to FIGS. 3C and 3E, illustrate an alternative embodiment of the steps described in relation with FIGS. 3C and 3E.

FIG. 4C shows the structure of FIG. 3B after the deposition of layer 29 and the etching of a rectangular cavity 41 in layer 29. Cavity 41 is similar to cavity 31 but for the fact that the etching of cavity 41 is stopped to form a notch region in bar 27 and layer 23. The bottom of cavity 41 is then at a level lower than that of the upper surface of bar 27.

FIG. 4E shows the structure of FIG. 4C after the filling of cavity 41 with the second material to form a bar 43 therein. Similarly to bars 27 and 33, bars 27 and 43 form a cruciform pattern 45 equivalent to pattern 11 of FIG. 2, but for the fact that bar 43 penetrates across a portion of the thickness of bar 27. Pattern 45 is at least partly free of the disadvantages of pattern 11.

Figure 5C:
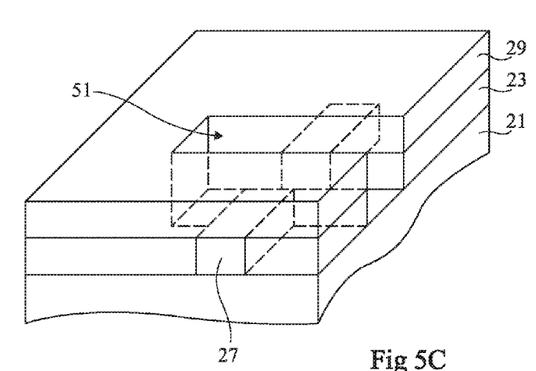
FIGS. 5C and 5E are cross-section and perspective views illustrating another variation of the steps of FIGS. 3C and 3E.
Figure 5E:
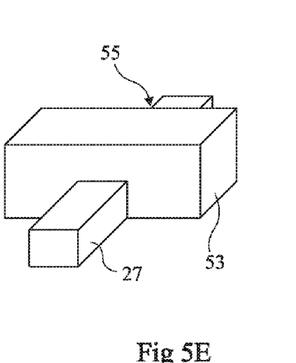

FIGS. 5C and 5E, similar to FIGS. 3C and 3E, illustrate another alternative embodiment of the steps described in relation with FIGS. 3C and 3E.

FIG. 5C shows the structure of FIG. 3B after the deposition of layer 29 and the etching of a cavity 51 in layer 29. The etching of cavity 51 is similar to that of cavity 31, but for the fact that cavity 51 is etched through the entire thickness of bar 27 (to form a notch region) and layer 23. The bottom of cavity 51 is then at the same level as the lower surface of layer 23.

FIG. 5E shows the structure of FIG. 5C after the filling of cavity 51 with the second material to form a bar 53 therein. Similarly to bars 27 and 33, bars 27 and 53 form a cruciform pattern 55 equivalent to pattern 11 of FIG. 2, but for the fact that bar 53 penetrates across the entire thickness of bar 27. Pattern 55 is at least partly free of the disadvantages of pattern 11.

Due to the fact that, in the manufacturing methods described in relation with FIGS. 3A to 5E, the bars forming a pattern of a spectral filter are formed one after the others, the angles of the pattern are sharp, conversely to the case where the pattern is obtained according to the method described in relation with FIG. 2. At least certain optical properties of a filter comprising a pattern of the type of patterns 35, 45, or 55 are then better than those of a filter comprising patterns of the type of pattern 11.

As previously indicated, the first and second materials and the different dimensions of patterns 35, 45, or 55 are selected according to the range of wavelengths that the filter should transmit. These materials and these dimensions may be determined by means of a simulation tool such as Comsol, Lumerica, or Rsoft.

Due to the fact that, conversely to a pattern 11, each bar of a pattern 35, 45, or 55 may have a different thickness and may penetrate more or less deeply into another bar of the pattern, additional parameters are available for those skilled in the art to adapt the optical properties of a filter comprising one or a plurality of patterns 35, 45, or 55.

Further, the fact of forming the bars of a pattern one after the others enables to manufacture a pattern where the angle between the longitudinal directions of two bars of the pattern is smaller than 45°, for example, 20°, which cannot be achieved with the manufacturing method described in relation with FIG. 2 when the dimensions of the bars become smaller than some hundred nanometers.

As an example, the first material is a metal selected from the group comprising aluminum, copper, tungsten, platinum, silver, gold, or an alloy of at least two of these metals. The second material is for example a dielectric material selected from the group comprising silicon nitride, silicon oxynitride, silicon oxide, titanium dioxide, magnesium fluoride, hafnium oxide, or silicon carbide. The first and second materials may be exchanged. The first and second materials may also be dielectric materials having different optical indexes.

Support 21 is for example a layer of the second material. In this case, at the steps of FIGS. 3E, 4E, and 5E, when a layer of the second material is left in place on the upper surface of the first material, pattern 35, 45, or 55 then extends between two layers of the second material. Support 21 may also be the upper surface of a stack of layers coating a semiconductor substrate having one or a plurality of photodetectors or photoemitters formed therein. Support 21 may also be a window glass, for example, to block ultraviolet and/or infrared rays.

As a comparison, a first filter and a second filter having their bandwidth centered on the 420-nm wavelength, that is, filters transparent to visible violet light, are considered. The first filter comprises a first cruciform pattern on a single level and the second filter comprises a second cruciform pattern of the type of that in FIG. 3E, on two levels and equivalent to the first pattern. Each arm of the first pattern has a 40-nm thickness, a first side having a length 13 of 24 nm, and a second side having a length 15 of 72 nm. Each bar 27 and 33 of the second pattern has a 20-nm thickness, a 120-nm length, and a 72-nm width. Each pattern is made of silicon oxide and is periodically repeated in an aluminum layer according to a 150-nm period.

Figure 6A:
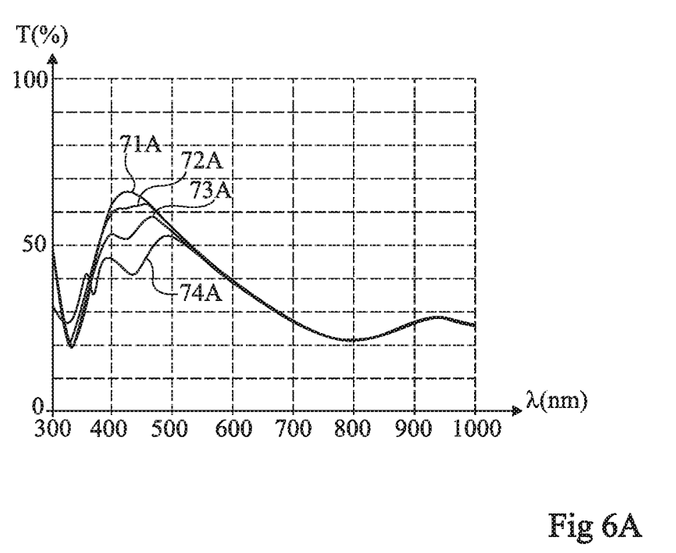
FIGS. 6A and 6B illustrate the variation of the light transmission rate according to the wavelength and for different angles of incidence of light, for various filter types.
Figure 6B:
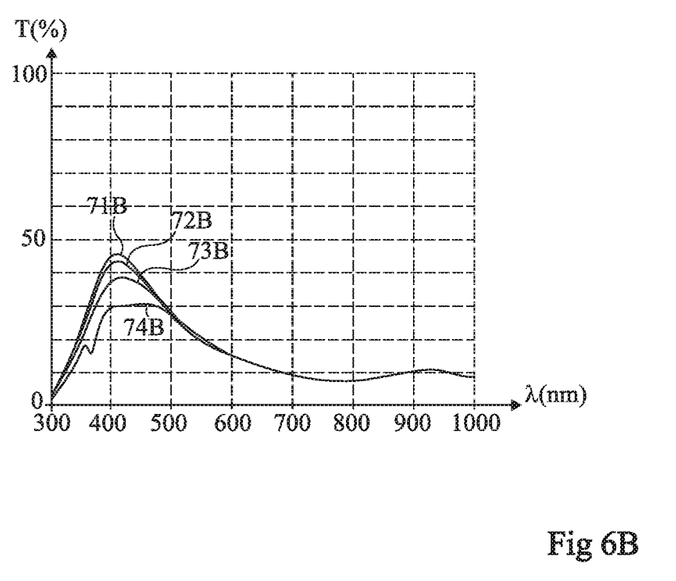

FIGS. 6A and 6B illustrate, respectively for the first filter and the second filter defined in the comparative example, the variation of transmission rate T (in %) according to wavelength $\lambda$ (in nm). The curves are obtained by simulation in the ideal case where the filter patterns are perfect, that is, where their angles are not rounded.

FIG. 6A comprises four curves 71A, 72A, 73A, and 74A of the variation of transmission rate T according to wavelength k, respectively for angles of incidence of light of 0, 15, 30, and 60°.

FIG. 6B comprises four curves 71B, 72B, 73B, and 74B of the variation of transmission rate T according to wavelength $\lambda$, respectively for angles of incidence of light of 0, 15, 30, and 60°.

As shown in the drawings, for a wavelength of approximately 420 nm, the distances between curves 71B, 72B, 73B, and 74B taken two by two are smaller than the corresponding distances between curves 71A, 72A, 73A, and 74A. In other words, the second filter comprising pattern 35 on two levels is less sensitive to the angle of incidence of light than the first filter comprising pattern 11 on a single level.

For wavelengths distant from the bandwidth, the values of the transmission rates of curves 71B, 72B, 73B, and 74B are smaller than the corresponding transmission rate values of curves 71A, 72A, 73A, and 74A, respectively. In other words, the rejection ratio of the second filter, outside of the bandwidth, is better than that of the first filter.

It can also be observed that the bandwidth of the second filter is narrower than that of the first filter. In other words, the second filter is more selective than the first one.

Thus, the second filter has optical properties, some of which are better than those of the first filter.

The advantages of the second filter as compared with the first filter still more clearly appear in the case where the first filter is a real filter having rounded cruciform patterns such as shown in FIG. 2, and the second filter is a real filter obtained according to the method of FIGS. 3A to 3E. The inventors have observed that, for filters having the above-defined dimensions, the maximum value of the transmission rate of the first filter becomes lower than 40%, instead of 65% in the ideal case, while the maximum value of the transmission rate of the second filter remains equal to 45%.

The advantages of the second filter over the first filter remain true when the pattern of the first filter is obtained according to the method described in relation with FIGS. 4C and 4E or with FIGS. 5C and 5E.

Methods of manufacturing a filter comprising a pattern capable of being divided into two bars have been previously described. It should be understood that such manufacturing methods may be adapted to manufacture filters with pattern(s) capable of being divided into more than two bars. For example, a pattern which may be divided into three bars may be obtained from a structure of the type obtained at the steps illustrated in FIGS. 3E, 4E, and 5E by depositing an additional layer of the first material on layer 29; by then etching another rectangular cavity through this layer all the way to one and/or the other of bars 27 and 33, 43, or 53; and by filling this other cavity with the second material to form therein a third bar of the pattern.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing a spectral filter, comprising the successive steps of:
    a) depositing a first layer made of a first material on a top surface of a support, the first layer having a top surface parallel to the top surface of the support;
    b) forming in said first layer a first rectangular bar made of a second material having an optical index different from an optical index of the first material; wherein step b) comprises the successive steps of:
       b1) etching through an entire thickness of the first layer to form a first rectangular cavity; and
       b2) filling the first rectangular cavity with the second material to form the first rectangular bar therein, wherein step b2) further comprises:
          depositing a layer of the second material on the first layer to fill the first rectangular cavity; and
          removing a portion of the second material by planarizing etching down to the top surface of the first layer;
    c) depositing a second layer made of the first material on a top surface of the first layer, the second layer having a top surface parallel to the top surface of the first layer; and
    d) forming in at least said second layer a second rectangular bar made of the second material and in contact with the first rectangular bar.

2. The method of claim 1, wherein step d) forming comprises forming said second rectangular bar in both said second layer and further in at least a portion of said first layer.

3. The method of claim 1, wherein the first material is a metal and the second material is a dielectric.

4. The method of claim 1, wherein the first material is a dielectric and the second material is a metal.

5. The method of claim 1, wherein step d) forming comprises the successive steps of:
   d1) etching through at least an entire thickness of the second layer to form a second rectangular cavity; and
   d2) filling the second rectangular cavity with the second material to form the second rectangular bar therein.

6. The method of claim 5, wherein step d1 etching further comprises etching into at least a portion of a thickness of the first layer.

7. The method of claim 5, wherein step d1 etching further comprises etching through the entire thickness of the first layer.

8. The method of claim 1, wherein the first rectangular bar and the second rectangular bar extend lengthwise along different directions.

9. The method of claim 8, wherein said different directions are orthogonal.

10. A spectral filter, comprising:
    a support;
    a layer made of a first material having a first rectangular bar and a second rectangular bar, the first and second rectangular bars made of a second material having an optical index different from an optical index of the first material, wherein a bottom surface of first rectangular bar is spaced from a top surface of the support by a different distance than a bottom surface of the second rectangular bar is spaced from the top surface of the support,
    wherein the first rectangular bar is located at a further position from the support than the second rectangular bar forming a notch in the second rectangular bar, such that the bottom surface of the first rectangular bar is at a shorter distance from the support than the second rectangular bar's thickness,
    the first rectangular bar extending lengthwise along first direction,
    the second rectangular bar extending lengthwise along a second direction,
    wherein the first and second directions are different, and
    wherein a portion of the second rectangular bar rests on and extends above the first rectangular bar.

11. The spectral filter of claim 10, wherein said first and second directions are orthogonal.

12. The spectral filter of claim 11, wherein the first and the second rectangular bars form a cruciform.

13. A spectral filter, comprising:
    a layer made of a first material having a first rectangular bar and a second rectangular bar, the first and second rectangular bars made of a second material having an optical index different from an optical index of the first material,
    the first rectangular bar extending lengthwise along first direction,
    the second rectangular bar extending lengthwise along a second direction,
    wherein the first and second directions are different, and
    wherein a portion of the second rectangular bar rests on and extends above the first rectangular bar;
    wherein said first rectangular bar includes a notch region and wherein said second rectangular bar extends through said notch region.

14. The spectral filter of claim 13, wherein said notch region extends only partially through a thickness of said first rectangular bar.

15. The spectral filter of claim 13, wherein said notch region extends completely through a thickness of said first rectangular bar.

16. An image sensor, comprising:
    a support including an array of photodetectors; and
    a spectral filter over at least one photodetector of the array, wherein said spectral filter comprises:
        a layer made of a first material having a first rectangular bar and a second rectangular bar, the first and second rectangular bars made of a second material having an optical index different from an optical index of the first material, wherein a bottom surface of first rectangular bar is spaced from a top surface of the support by a different distance than a bottom surface of the second rectangular bar is spaced from the top surface of the support,
        the first rectangular bar extending lengthwise along first direction,
        the second rectangular bar extending lengthwise along a second direction,
        wherein said first rectangular bar includes a notch region and wherein said second rectangular bar extends through said notch region,
        wherein the first and second directions are different, and
        wherein a portion of the second rectangular bar rests on and extends above the first rectangular bar.

17. The image sensor of claim 16, wherein said notch region extends only partially through a thickness of said first rectangular bar.

18. The image sensor of claim 16, wherein said notch region extends completely through a thickness of said first rectangular bar.

19. The image sensor of claim 16, wherein said first and second directions are orthogonal.

20. The image sensor of claim 19, wherein the first and the second rectangular bars form a cruciform.

21. A spectral filter, comprising:
    a support;
    a layer made of a first material having a first rectangular bar and a second rectangular bar, the first and second rectangular bars made of a second material having an optical index different from an optical index of the first material, wherein a top surface of first rectangular bar is spaced from a top surface of the support by a different distance than a top surface of the second rectangular bar is spaced from the top surface of the support,
    the first rectangular bar extending lengthwise along first direction,
    wherein said first rectangular bar includes a notch region and wherein said second rectangular bar extends through said notch region, said notch region extending partially through a thickness of said first rectangular bar,
    the second rectangular bar extending lengthwise along a second direction,
    wherein the first and second directions are different, and
    wherein a portion of the second rectangular bar rests on and extends above the first rectangular bar.

22. The spectral filter of claim 21, wherein said first and second directions are orthogonal.

23. The spectral filter of claim 22, wherein the first and the second rectangular bars form a cruciform.

24. The spectral filter of claim 21, wherein said notch region extends completely through a thickness of said first rectangular bar.

25. An image sensor, comprising:
a support including an array of photodetectors; and
a spectral filter over at least one photodetector of the array, wherein said spectral filter comprises:
a layer made of a first material having a first rectangular bar and a second rectangular bar, the first and second rectangular bars made of a second material having an optical index different from an optical index of the first material, wherein a top surface of first rectangular bar is spaced from a top surface of the support by a different distance than a top surface of the second rectangular bar is spaced from the top surface of the support,
the first rectangular bar extending lengthwise along first direction,
the second rectangular bar extending lengthwise along a second direction,
wherein said first rectangular bar includes a notch region and wherein said second rectangular bar extends through said notch region,
wherein the first and second directions are different, and
wherein a portion of the second rectangular bar rests on and extends above the first rectangular bar.

26. The image sensor of claim 25, wherein said first and second directions are orthogonal.

27. The image sensor of claim 26, wherein the first and the second rectangular bars form a cruciform.

28. The image sensor of claim 25, wherein said notch region extends only partially through a thickness of said first rectangular bar.

29. The image sensor of claim 25, wherein said notch region extends completely through a thickness of said first rectangular bar.

* * * * *